United States Patent [19]

Warren

[11] 3,895,310

[45] July 15, 1975

[54] AUTOMATIC GAIN CONTROL CIRCUIT

[75] Inventor: George H. Warren, San Jose, Calif.

[73] Assignee: Kinetic Technology Inc., Santa Clara, Calif.

[22] Filed: Jan. 31, 1974

[21] Appl. No.: 438,184

[52] U.S. Cl. .................................... 330/145; 330/29

[51] Int. Cl.$^2$ ........................................... H03G 3/20

[58] Field of Search ................. 330/29, 35, 86, 145; 325/319, 413

[56] References Cited

UNITED STATES PATENTS

| | | | |
|---|---|---|---|
| 3,441,748 | 4/1969 | Werner | 307/237 |
| 3,576,451 | 4/1971 | Markow | 330/145 X |
| 3,579,138 | 5/1971 | Harris et al. | 330/86 |
| 3,581,223 | 5/1971 | Armstrong | 330/29 |
| 3,719,895 | 3/1973 | Van der Paije | 330/136 X |
| 3,723,897 | 3/1973 | Barnes | 330/145 X |

OTHER PUBLICATIONS

Knighton, "Single Transistor Rectifies AGC Signal," Electronics, Jan. 8, 1968, p. 90.

Doyle, "FET and OP-AMP Audio Circuits," Radio-Electronics, July, 1970, pp. 46–49.

Handbook of Operational Amplifier Applications. Burr-Brown Research Corp., Copyright 1963, p. 70.

*Primary Examiner*—James B. Mullins
*Attorney, Agent, or Firm*—Alan H. MacPherson

[57] ABSTRACT

An automatic gain control circuit comprises means for amplifying an input signal together with feedback means for controlling the gain of said means for amplifying such that the output signal from said means for amplifying is held to a substantially constant level when the input signal varies over a wide range of amplitudes. In one embodiment, the means for controlling the gain of the means for amplifying comprises a variable impedance such as an FET transistor the impedance of which is varied in verse proportion to the amplitude of the output signal from the means for amplifying thereby to hold the output signal level at a selected value.

6 Claims, 1 Drawing Figure

PATENTED JUL 15 1975 3,895,310
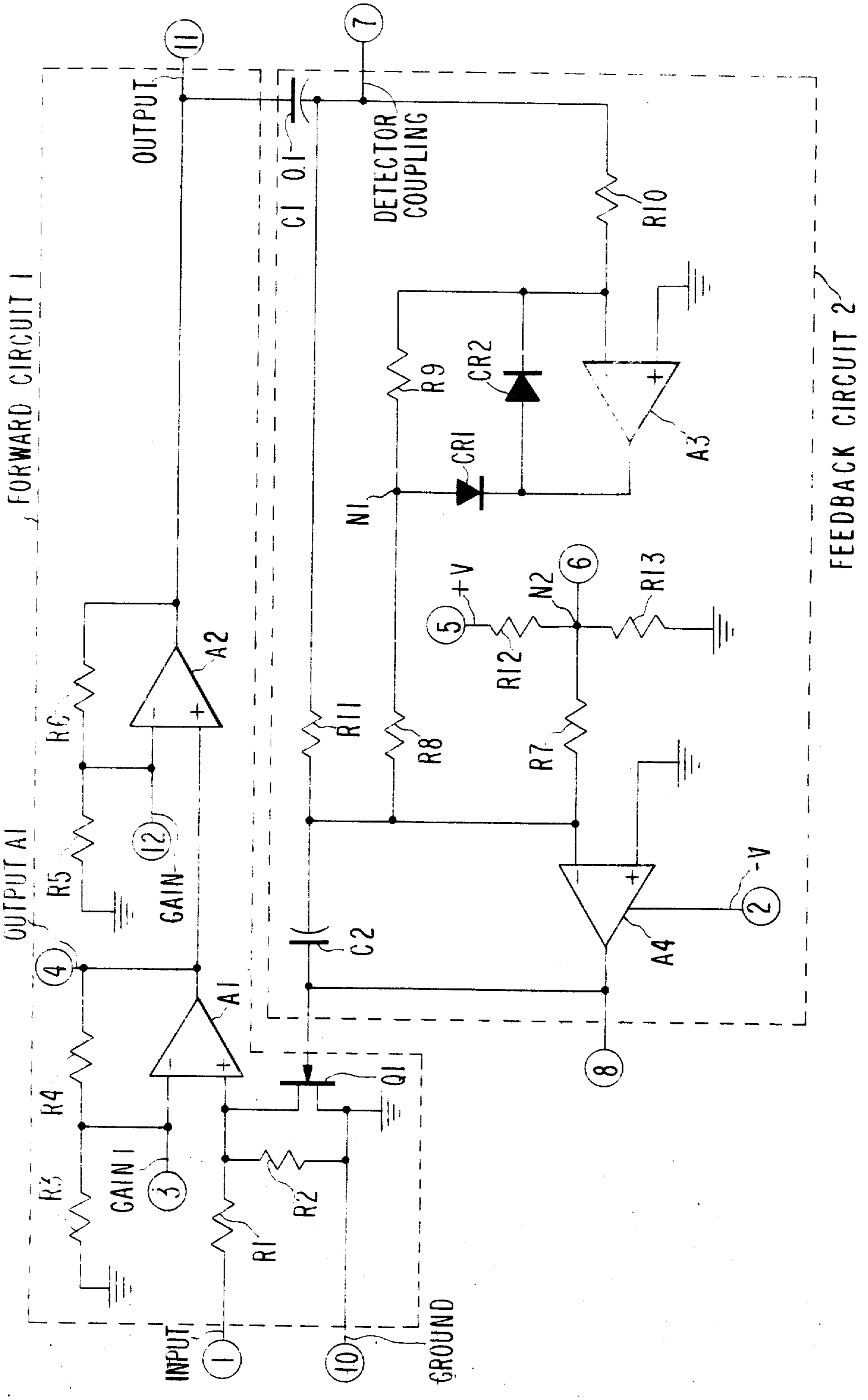

AUTOMATIC GAIN CONTROL CIRCUIT

BACKGROUND OF THE INVENTION

1. Field of the Invention

This invention relates to an automatic gain control (AGC) circuit and in particular to an AGC circuit which overcomes nonlinear operation by high feedback gain, such that the output signal from the circuit is independent of the amplitude of the input signal over a wide range of input signal amplitudes.

2. Prior Art

Automatic gain control circuits are well known. Typically, one such circuit operates by comparing the output signal from the circuit to a reference signal and adjusting the forward gain of the circuit to insure that the amplitude of the output signal is approximately equal to the amplitude of the selected reference signal despite the variation of the input signal over a wide range of levels. One problem of such prior circuits is that the maintenance of a constant amplitude output signal for a wide range of input signal amplitudes is difficult. Another problem is to make such an automatic gain control circuit is a compact, yet inexpensive manner.

SUMMARY OF THE INVENTION

This invention overcomes certain disadvantages of prior art AGC circuits by insuring that the output signal from the circuit is substantially independent of the amplitude of the input signal over a wide range of input signal amplitudes. This invention uses compact, commonly available semiconductor components to achieve, in one embodiment, a 0 dbm output signal with input signals varying from about −22 dbm to about +10 dbm. For signals below about −22 dbm, a constant 22 db gain to provided by this one embodiment. The principle of this invention can be used to achieve other gains and performance characteristics, as desired.

According to this invention an automatic gain control circuit comprises means for amplifying an AC input signal of variable amplitude to product an AC output signal, means for rectifying said AC output signal to produce a control signal, and means, responsive to said control signal, for varying the gain of said means for amplifying to insure that said AC output signal is approximately a selected amplitude independent of the amplitude of said AC input signal.

As a feature of the invention, the gain of the forward loop circuit is controlled by applying a signal derived from the output signal from the circuit to a variable impedance means associated with the means for amplifying the AC input circuit.

In one embodiment, the means, responsive to said control signal, for varying the gain of said means for amplifying, comprises a field effect transistor to the gate of which is applied the control signal. The control signal is developed in a feedback loop.

High gain in the feedback loop overcomes the nonlinearity of the circuit. In this embodiment a limiting circuit is provided to limit the output signal amplitude when the input signal exceeds a given amplitude. Despite the nonlinearity introduced by the feedback circuit, harmonics of a single audio tone signal are at least 20 db down from the fundamental. Thus distortion caused by circuit nonlinearities is minimized.

The output signal level is controlled by adjusting the feedback loop.

DESCRIPTION OF THE DRAWING

FIG. 1 shows the circuit diagram of the structure of this invention.

DETAILED DESCRIPTION

In the following description the value or type, as appropriate, of a circuit component used in one embodiment of this invention, will be placed in parenthesis following the first reference to the component. Components of different values or types than those given can, of course, be used provided the resulting circuit performance is acceptable.

An input signal, which can vary over a wide range of amplitudes, is applied at input lead 1 to resistor R1 (100K). Resistor R1 is connected to the positive input lead to amplifier A1. In one embodiment amplifier A1 comprises one amplifier of a dual operational amplifier of well known design such as the Signetics 558. The negative input lead to amplifier A1 is connected to the node between series-connected resistors R3 (9.09K) and R4 (100K). One lead of R3 is connected to ground and the other lead of R3 is connected to the negative input lead to amplifier A1. Resistor R4 is connected from the output lead of amplifier A1 to its negative input lead.

The output signal from amplifier A1 is applied to the positive input lead of amplifier A2, which is the other amplifier of the dual amplifier chip containing A1. The negative input lead to amplifier A2 is connected to the node between series-connected resistors R5 (9.09K) and R6 (100K). Resistors R5 and R6 are connected in series from ground to the output lead of amplifier A2. The output signal from amplifier A2 comprises the output signal from the circuit and is transmitted from the circuit on lead 11. Amplifiers A1 and A2 comprise constant gain amplifiers and in one embodiment each amplifier and its associated components provides a gain of about 21 db.

Connected between the positive input lead to amplifier A1 and ground is a parallel combination of resistor R2 (10K) and a variable impedance means Q1. In one embodiment, Q1 comprises a field effect transistor (FET). The impedance of Q1 is controlled by varying the voltage applied to its gate electrode. The signal applied to Q1's gate electrode is derived from the output signal on lead 11 by means of feedback circuit 2. Typically Q1 comprises a 2N 3823, a type produced by several manufacturers although other devices with similar characteristics can also be used, if desired.

The output signal from amplifier A2 on output lead 11 is transmitted through coupling capacitor C1 (0.1 $\mu$f) and resistor R10 (100K) to the negative input lead of amplifier A3 (Signetics 558). The positive input lead to amplifier A3 is grounded. Amplifier A3 together with diodes CR1 (1N914) and CR2 (1N914) and resistor R9 (100K) is connected to form a half-wave rectifier.

A positive input signal on the negative input lead to amplifier A3 results in a negative output signal from A3. Because the negative input lead to A3 is at virtual ground, diode CR1 is forward biased and diode CR2 is back biased. The ratio of the output voltage $E_o$ to the input voltage $E_i$ of amplifier A3 is given by the following equation when CR2 is back biased:

$$E_o / E_i = -R9 / R10 \qquad (1)$$

Because in the embodiment shown, resistors R9 and R10 are equal, the amplifier A3 functions as an inverter. Accordingly, a positive output signal from amplifier A2 appears at node N1 as an inverted signal.

A negative output signal from amplifier A2 results in a positive output signal being produced by amplifier A3. However, because the negative input lead to amplifier A3 is at virtual ground diode CR2 becomes forward biased as soon as the positive output signal from amplifier A3 exceeds the voltage (approximately 0.7 volts) sufficient to forward bias diode CR2. Accordingly, the combination of amplifier A3, resistors R9 and R10 and diodes CR1 and CR2 function as half-wave rectifier and inverter, converting the positive portions of the output signal from amplifier A2 into negative signals at node N1.

Addition of operational amplifier A4 and capacitor C2 (0.0047 μf) to the feedback circuit amplifier A3 and its associated components (CR1, CR2, R9, R10) causes the feedback circuit to function as a full-wave rectifier. The positive input lead to operational amplifier A4 is grounded while the negative input lead to amplifier A4 is connected through resistor R11 (200K) and capacitor C1 to the output lead from amplifier A2, through resistors R8 (100K) to node N1 containing the output signal from amplifier A3, and through resistor R7 (200K) to the node N2 between resistors R12 (150K) and R13 (10K) connected in series as a voltage divider. Resistor R12 is connected to positive voltage source 5 and node N2 between resistors R12 and R13 is an adjustable potential thereby allowing the positive reference level to the negative output lead of amplifier A4 to be varied.

The negative input lead to amplifier A4 is also at virtual ground; therefore, the sum of the currents on this input lead is approximately zero. Assuming for the moment that the output signal from amplifier A2 is sinusoid, the output signal from amplifier A3 comprises an inverted version of the positive portion of the sinusoid from amplifier A2. By correctly selecting the ratio of R8 and R11, the amplitude of this inverted version of the sinusoid from A2 at the negative input lead to A4 is made twice the amplitude of the positive portion of the sinusoid from A2. Because the inverting (negative) input lead to A4 is at virtual ground, the negative current from the amplifying and rectifying circuit containing A3 is balanced by current from capacitor C2 during the time C2 is being charged, or by current through R7 from node N2 connected by R12 to voltage source 5 during steady state, or by both these currents. Capacitor C2 integrates the output signal from amplifier A4 and thus a full wave rectified, filtered dc signal appears at the output lead of amplifier A4. This output signal from A4 drives the gate of variable impedance device Q1 thereby controlling the impedance of this device and thus the gain of the amplifying circuit of which amplifier A1 is a part. Variable impedance means Q1 is placed between the positive input lead of amplifier A1 and ground. By controlling the impedance of Q1, the gain of the amplifying circuit containing amplifier A1 is controlled.

The gate voltage of Q1 for input signal of −22 dbm is approximately −10.5 volts. The gate voltage then varies to maintain the output signal level constant until for an input signal greater in amplitude than +10dbm, the gate voltage on Q1 goes to and remains at approximately +10.5 volts.

Resistor R2 is selected to limit the voltage swing across the drain of Q1 to prevent Q1 from being turned on or off by the input signal at the drain of Q1.

If the output signal from amplifier A2 becomes too large (small), then the output signal from amplifier A4 increases (decreases) the gate voltage on Q1 thereby decreasing (increasing) the impedance between the positive input lead to amplifier A1 and ground. This decreases (increases) the gain of the amplifying circuit containing amplifier A1 until the output signal from amplifier A2 on output lead 11 from the forward circuit returns to its correct value. By use of high gain for amplifier A4 in the feedback circuit, very small changes in amplitude of the output signal on output lead 11 in the forward circuit 1 result in sufficient change in the impedance presented by transistor Q1 to bring the output signal back to its proper value.

The amplitude of the output signal on lead 11 from the circuit is controlled by controlling the voltage at node N2 between series-connected resistors R12 and R13. Resistors R12 and R13 are connected as a voltage divider (which can, if desired, be made variable) between voltage source 5 and ground. Resistor R7 is connected to the node between resistors R12 and R13 and the negative input lead of amplifier A4. Normally the voltage at node N2 is set for zero dbm out.

While one embodiment of this invention has been described, other embodiments will be obvious in view of this disclosure.

As a feature of this invention the two amplifiers in the forward circuit and the two amplifiers in the feedback circuit and the associated components are interconnected in such a manner as to provide stable operation over a wide range of input signal amplitudes and frequencies.

What is claimed is:

1. An automatic gain control circuit comprising:
means for amplifying an AC input signal to produce an AC output signal with an amplitude substantially independent of the amplitude of said AC input signal when the amplitude of said AC input signal is within a selected range of amplitudes;
means for developing from said AC output signal a control signal, said means for developing said control signal comprising
means for half wave rectifying and inverting said AC output signal to produce a first intermediate signal, comprising
a first operational amplifier means possessing a negative input lead, a positive input lead and an output lead;
means coupling said negative input lead to said means for amplifying thereby to transmit said AC output signal from said means for amplifying to said negative input lead;
means connecting said positive input lead to ground;
a first diode connecting said output lead to said negative input lead, said first diode being arranged to conduct current during the time the signal on said output lead is of positive polarity relative to the signal on said negative input lead;

a first resistor connecting said negative input lead to a first node; and a second diode connecting said first node to said output lead, said second diode being arranged to conduct current during the time the signal on said first node is of positive polarity relative to the signal on said output lead;

thereby to produce on said first node said first intermediate signal;

means for combining said AC output signal and said first intermediate signal to produce a second intermediate signal of opposite polarity to the polarity of said AC output signal during the time said AC output signal has a first selected polarity and of the same polarity as said AC output signal during the time said AC output signal is of said opposite polarity and means for producing said control signal from said second intermediate signal, comprising means, including a second resistor, coupled to said means for amplifying, for transmitting said AC output signal to a second node;

a third resistor coupling said first node to said second node;

second operational amplifier means possessing a negative input lead, a positive input lead, and an output lead, said negative input lead of said second operational amplifier means being connected to said second node;

voltage divider means connected between a voltage source and ground;

a fourth resistor connecting a selected point on said voltage divider means to said second node;

means connecting the positive input lead of said second operational amplifier means to ground;

capacitive means coupling said output lead of said second operational amplifier means to the negative input lead of said second operational amplifier means;

thereby to produce on said output lead said control signal; and means, responsive to said control signal, for varying the gain of said means of amplifying to insure that said AC output signal has a substantially constant amplitude independent of the amplitude of said AC input signal when the amplitude of said AC input signal is within a selected range of amplitudes.

2. Structure as in claim 1 wherein said means for varying the gain of said means for amplifying comprises a variable impedance means connected so as to vary the gain of said means for amplifying.

3. Structure as in claim 2 wherein said means for amplifying comprises means for attenuating said AC input signal and fixed gain means for amplifying said AC input signal and said variable impedance means comprises part of said means for attenuating.

4. Structure as in claim 3, wherein said variable impedance means is in parallel with a fifth resistor.

5. Structure as in claim 3 wherein said selected polarity is positive.

6. Structure as in claim 2 wherein said second resistor and said third resistor are selected such that the amplitude of the first intermediate signal is twice the amplitude of the AC output signal from the means for amplifying during the time that said AC output signal is of said selected polarity and is approximately zero during the time said AC output signal is of opposite polarity.

* * * * *